United States Patent
Song

(10) Patent No.: US 12,407,176 B2
(45) Date of Patent: Sep. 2, 2025

(54) BATTERY MANAGEMENT APPARATUS

(71) Applicant: LG Energy Solution, Ltd., Seoul (KR)

(72) Inventor: Hyeon-Jin Song, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 863 days.

(21) Appl. No.: 17/637,883

(22) PCT Filed: Sep. 16, 2020

(86) PCT No.: PCT/KR2020/012508
§ 371 (c)(1),
(2) Date: Feb. 24, 2022

(87) PCT Pub. No.: WO2021/066357
PCT Pub. Date: Apr. 8, 2021

(65) Prior Publication Data
US 2022/0317206 A1   Oct. 6, 2022

(30) Foreign Application Priority Data

Oct. 4, 2019   (KR) .................. 10-2019-0123403

(51) Int. Cl.
*H02J 7/00* (2006.01)
*G01R 1/20* (2006.01)
(Continued)

(52) U.S. Cl.
CPC ............ *H02J 7/0047* (2013.01); *G01R 1/203* (2013.01); *G01R 31/64* (2020.01);
(Continued)

(58) Field of Classification Search
CPC .................................................. H02J 7/0047
(Continued)

(56) References Cited

U.S. PATENT DOCUMENTS 4,881,014 A   11/1989   Okochi
5,798,648 A   8/1998   Ueyama et al.
(Continued)

FOREIGN PATENT DOCUMENTS

CN   1302468 A   7/2001
CN   101207296 A   6/2008
(Continued)

OTHER PUBLICATIONS

Search Report dated Jul. 28, 2023 from the Office Action for Chinese Application No. 202080059104.3 issued Jul. 29, 2023, 3 pages. [See p. 1-2, categorizing the cited references].
(Continued)

*Primary Examiner* — Eric D Lee
(74) *Attorney, Agent, or Firm* — Lerner David LLP

(57) ABSTRACT

A battery management apparatus includes: an inverter connected to a battery cell and configured to convert a DC current output from the battery cell into an AC current according to an operation state of a plurality of switches provided therein; a measuring unit connected to a diagnosis line at which the AC current converted by the inverter is output, the measuring unit being configured to measure a voltage of the diagnosis line and output the measurement result; and a control unit having a plurality of capacitors connected to the diagnosis line and configured to control the operation state of the plurality of switches, receive the measurement result output from the measuring unit and diagnose a state of the plurality of capacitors based on the received measurement result.

11 Claims, 5 Drawing Sheets

(51) Int. Cl.
*G01R 31/64* (2020.01)
*H01M 10/42* (2006.01)
*H01M 10/48* (2006.01)

(52) U.S. Cl.
CPC ..... *H01M 10/4264* (2013.01); *H01M 10/482* (2013.01); *H02J 7/0013* (2013.01); *H01M 2010/4271* (2013.01); *H02J 2207/20* (2020.01)

(58) Field of Classification Search
USPC ........................................................ 320/135
See application file for complete search history.

(56) References Cited

U.S. PATENT DOCUMENTS

| | | | |
|---|---|---|---|
| 6,121,756 | A | 9/2000 | Johnson, Jr. et al. |
| 2008/0170181 | A1 | 7/2008 | Schou et al. |
| 2011/0285539 | A1 | 11/2011 | Lee et al. |
| 2014/0002104 | A1 | 1/2014 | Yang |
| 2014/0119067 | A1 | 5/2014 | Choi et al. |
| 2016/0377565 | A1 | 12/2016 | Mollov et al. |
| 2017/0373628 | A1 | 12/2017 | Nozawa |
| 2018/0003745 | A1 | 1/2018 | Oh et al. |
| 2019/0081572 | A1 | 3/2019 | Hatano |

FOREIGN PATENT DOCUMENTS

| | | |
|---|---|---|
| CN | 102906581 A | 1/2013 |
| CN | 103795284 A | 5/2014 |
| EP | 2682769 A1 | 1/2014 |
| JP | S62233067 A | 10/1987 |
| JP | H08251938 A | 9/1996 |
| JP | 200169767 A | 3/2001 |
| JP | 2004140961 A | 5/2004 |
| JP | 2006320176 A | 11/2006 |
| JP | 4103946 B2 | 6/2008 |
| JP | 2017-11263 A | 1/2017 |
| JP | 201814868 A | 1/2018 |
| JP | 2018148674 A | 9/2018 |
| JP | 201954714 A | 4/2019 |
| JP | 2019138656 A | 8/2019 |
| KR | 100407017 B1 | 11/2003 |
| KR | 101327591 B1 | 11/2013 |
| KR | 20150109154 A | 10/2015 |
| KR | 101661379 B1 | 9/2016 |
| KR | 20180013150 A | 2/2018 |
| KR | 20180038168 A | 4/2018 |
| KR | 20180074934 A | 7/2018 |
| KR | 101887440 B1 | 8/2018 |
| WO | WO-2014106144 A1 * | 7/2014 ............. H02J 7/345 |
| WO | 2016108624 A1 | 7/2016 |
| WO | 2018185963 A1 | 10/2018 |

OTHER PUBLICATIONS

International Search Report for PCT/KR2020/012508 dated Jan. 4, 2021. 3 pgs.

Extended European Search Report for Application No. 20871810.6 dated Sep. 19, 2022. 7 pgs.

* cited by examiner

BATTERY MANAGEMENT APPARATUS

CROSS-REFERENCE TO RELATED APPLICATIONS

The present application is a national phase entry under 35 U.S.C. § 371 of International Application No. PCT/KR2020/012508 filed Sep. 16, 2020, published in Korean, which claims priority from Korean Patent Application No. 10-2019-0123403 filed Oct. 4, 2019, all of which are incorporated herein by reference.

TECHNICAL FIELD

The present disclosure relates to a battery management apparatus, and more particularly, to a battery management apparatus for diagnosing a state of a capacitor provided in a control unit.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-discharging rate and high energy density.

Meanwhile, a battery pack having a battery may include a capacitor for smoothing the DC power output from the battery. That is, the capacitor is a DC link capacitor or a smoothing capacitor and may smooth the DC power to a certain level.

However, since the smoothing capacitor frequently fails due to degradation, it is important to accurately diagnose a state of the smoothing capacitor.

Conventionally, there has been disclosed a technique for controlling a DC power supplied from a power supplier to a motor to a certain magnitude, estimating a rate of change of the DC link capacitance in consideration of a power consumed by a resistor of the motor, a power consumed by the power supplier and a switching loss power of the inverter when the DC link voltage reaches a predetermined voltage, and diagnosing the degree of degradation of the DC link capacitor using the rate of change of the DC link capacitance (Patent Literature 1).

However, in Patent Literature 1, the DC link capacitor is discharged through the motor to measure the capacitance. For this, the motor must be stopped, and the system must also be stopped to cut off the power to the inverter, so it is difficult to frequently measure the degradation of the capacitor. In addition, if the motor is replaced with another motor after measuring an initial value of the capacitance, the power consumed by a load is changed, so an error may occur.

(Patent Literature 1) KR 10-1327591 B1

SUMMARY

Technical Problem

The present disclosure is designed to solve the problems of the related art, and therefore the present disclosure is directed to providing a battery management apparatus, which diagnosing a state of a capacitor provided in a control unit by applying an AC current.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a battery management apparatus, comprising: an inverter connected to a battery cell and including a plurality of switches, the inverter configured to convert a DC current output from the battery cell into an AC current according to respective operation states of the plurality of switches; a sensor connected to a diagnosis line at which the AC current is output, the sensor configured to measure a voltage of the diagnosis line and output the measured voltage; and a controller including a plurality of capacitors connected to the diagnosis line, wherein the controller is configured to: control the respective operation states of the plurality of switches; receive the measured voltage from the sensor; and diagnose a state of the plurality of capacitors based on the received measured voltage.

The inverter may include a first unit circuit connected to the battery cell and including the plurality of switches and a plurality of primary coils arranged in series; and a second unit circuit connected to the diagnosis line and including a secondary coil inductively coupled to the plurality of primary coils.

The controller may be configured to alternately control the respective operation states of a first switch and a second switch of the plurality of switches according to a predetermined cycle.

The sensor may be configured to: measure voltages at both ends of a shunt resistor provided on the diagnosis line in response to a measurement command received from the controller and calculate a difference between the measured voltages at both ends of the shunt resistor.

The controller may include a third switch configured to switchably control selection from among the plurality of capacitors to be connected to the diagnosis line, and the controller may be configured to diagnose a state of each of the plurality of capacitors by controlling the third switch.

The controller may be configured to control the third switch in response to the received measured voltage being different from a reference value by a predetermined amount or more.

The controller may be configured to control connection of a predetermined capacitor of the plurality of capacitors to the diagnosis line by the third switch, control the respective operation states of the plurality of switches to output the AC current, and diagnose a state of the predetermined capacitor based on a re-measurement of the measured voltage received from the sensor.

The inverter may be connected to a plurality of battery cells including the battery cell and the battery management apparatus may be configured to select one of the plurality of battery cells to be connected to the inverter according to a cell selection command of the controller.

The controller may include a plurality of slave controllers, each slave controller including a respective plurality of capacitors; and a master controller connected to the plurality of slave controllers and configured to generate the cell selection command.

The battery management apparatus according to another aspect of the present disclosure may be configured to connect one of the plurality of slave controllers to the inverter through the diagnosis line in response to a slave selection command generated by the master controller.

The battery management apparatus may include a plurality of inverters including the inverter connected to a plurality of battery cells including the battery cell in a one-to-one correspondence.

The controller may include a plurality of slave controllers, wherein each respective slave controller corresponds to a respective one of the plurality of inverters and includes a respective plurality of capacitors; and a master controller connected to the plurality of slave controllers and configured to designate one of the slave controllers to diagnose the state of the plurality of capacitors included in the designated slave.

A battery management system (BMS) according to still another aspect of the present disclosure may comprise the battery management apparatus according to any of the embodiments described in present disclosure.

A battery pack according to still another aspect of the present disclosure may comprise the battery management apparatus according to any of the embodiments described in the present disclosure.

Advantageous Effects

According to an aspect of the present disclosure, even if a special measuring device is not provided, there is an advantage that the state of a capacitor provided inside the control unit may be diagnosed.

In addition, according to an aspect of the present disclosure, since the battery cell that outputs a current and the capacitor to be diagnosed can be selected through a simple circuit configuration inside the battery pack, the manufacturing time and cost of the battery pack may be reduced.

In addition, according to an aspect of the present disclosure, since a plurality of capacitors are provided inside the control unit, it is possible to effectively prevent loss of a signal input to the control unit.

The effects of the present disclosure are not limited to the above, and other effects not mentioned herein will be clearly understood by those skilled in the art from the appended claims.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, a preferred embodiment of the present disclosure will be described in detail with reference to the accompanying drawings.

Figure 1:
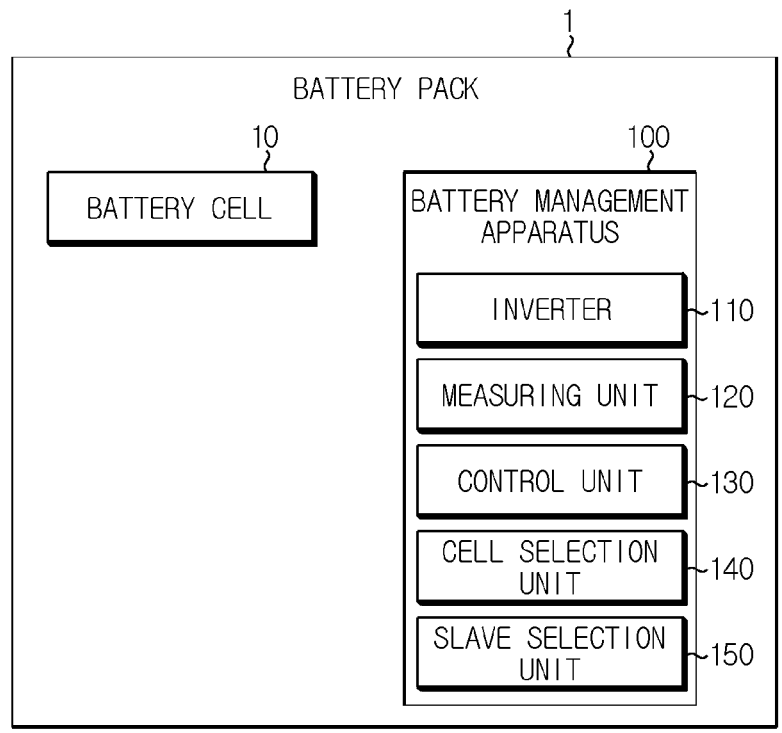
FIG. 1 is a diagram schematically showing a battery pack including a battery management apparatus according to an embodiment of the present disclosure.
Figure 2:
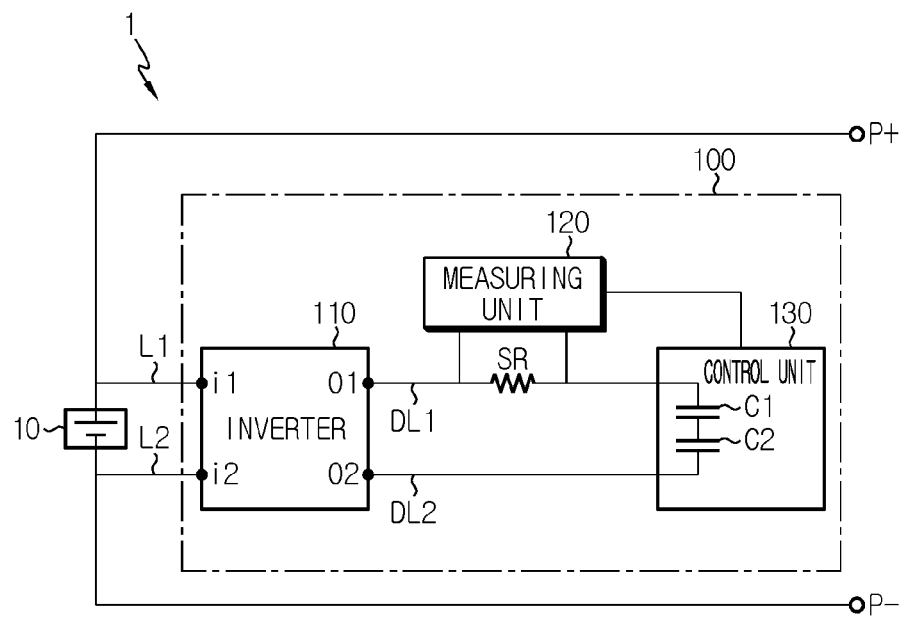
FIG. 2 is a diagram showing an exemplary configuration of the battery pack including the battery management apparatus according to an embodiment of the present disclosure.

FIG. 1 is a diagram schematically showing a battery pack 1 including a battery management apparatus 100 according to an embodiment of the present disclosure, and FIG. 2 is a diagram showing an exemplary configuration of the battery pack 1 including the battery management apparatus 100 according to an embodiment of the present disclosure.

Referring to FIGS. 1 and 2, the battery pack 1 may include a battery cell 10 and a battery management apparatus 100. Here, the battery cell 10 refers to one independent cell that has a negative electrode terminal and a positive electrode terminal and is physically separable. For example, one pouch-type lithium polymer cell may be regarded as the battery cell 10.

The battery management apparatus 100 may include an inverter 110, a measuring unit 120 and a control unit 130.

The inverter 110 is connected to the battery cell 10 and may be configured to convert a DC current output from the battery cell 10 into an AC current according to an operation state of a plurality of switches included therein so as to output the AC current.

For example, the inverter 110 may be a DC-AC inverter 110 that converts a DC current output from the battery cell 10 into an AC current.

Specifically, the inverter 110 may include a plurality of input terminals and a plurality of output terminals. The inverter 110 may be connected to the battery cell 10 through a line that is connected to the plurality of input terminals. In addition, an AC current may be output through the line connected to the plurality of output terminals.

For example, referring to FIG. 2, the inverter 110 may be connected to the positive electrode terminal of the battery cell 10 through a first line L1 connected to a first input terminal it and be connected to the negative electrode terminal of the battery cell 10 through a second line L2 connected to a second input terminal i2. In addition, the AC current converted by the inverter 110 may be output through a first diagnosis line DL1 connected to a first output terminal O1 of the inverter 110 and a second diagnosis line DL2 connected to a second output terminal O2.

The measuring unit 120 may be configured to be connected to a diagnosis line at which the AC current converted by the inverter 110 is output.

In addition, the measuring unit 120 may be configured to measure a voltage of the diagnosis line and output a measurement result. For example, the measuring unit 120 may measure voltages of both ends of a predetermined element arranged on the diagnosis line and output the measured result.

The control unit 130 may be configured to include a plurality of capacitors connected to the diagnosis line.

Specifically, a plurality of capacitors may be disposed at an input terminal of the control unit 130 to which voltage is input. Here, the plurality of capacitors may be connected in series with each other. That is, the plurality of capacitors may be configured to smooth the input voltage by removing noise included in the voltage input to the control unit 130.

For example, referring to FIG. 2, a first capacitor C1 and a second capacitor C2 may be provided inside the control unit 130. One end of the first capacitor C1 may be connected to the first diagnosis line DL1, and the other end may be connected to one end of the second capacitor C2. The other end of the second capacitor C2 may be connected to the second diagnosis line DL2. However, it should be noted that in the embodiment of FIG. 2, only the diagnosis line is connected to the first capacitor C1 and the second capacitor C2 in order to diagnose the state of the first capacitor C1 and the second capacitor C2. That is, the first capacitor C1 and the second capacitor C2 may be connected to any line without limitation a long as the line is connected to the input terminal of the control unit 130 to apply a voltage to the control unit 130 at the inside or outside of the battery pack 1 as well as the diagnosis line, and may smooth the input voltage.

In addition, since a plurality of capacitors are provided inside the control unit 130, the voltage input to the control unit 130 may be stabilized even if any one of the plurality of capacitors is not in a normal state. Therefore, the control unit 130 may receive a stable voltage through the plurality of capacitors.

The control unit 130 may be configured to control the operation state of the plurality of switches.

Specifically, the control unit 130 may be connected to each of the plurality of switches provided in the inverter 110, and transmit a control command to each of the plurality of switches through the connected line. In this case, the operation state of the switch receiving the control command from the control unit 130 may be controlled to a turn-on state or a turn-off state.

The control unit 130 may be configured to receive the measurement result output from the measuring unit 120.

Preferably, the control unit 130 and the measuring unit 120 may be connected by wire. In addition, the control unit 130 may receive the measurement result measured by the measuring unit 120 through a connected line.

For example, in the embodiment of FIG. 2, the control unit 130 may be configured to receive the measurement result, obtained by measuring the voltage of the diagnosis line by the measuring unit 120, through the line connected to the measuring unit 120.

The control unit 130 may be configured to diagnose the state of the plurality of capacitors based on the received measurement result.

Specifically, the measuring unit 120 may convert the measurement result into a digital signal and send the converted digital signal to the control unit 130. The control unit 130 may receive the converted digital signal from the measuring unit 120 and the measurement result measured by the measuring unit 120 by reading the converted digital signal. In addition, the control unit 130 may diagnose whether the state of the plurality of capacitors is normal based on the obtained measurement result.

The battery management apparatus 100 according to an embodiment of the present disclosure has an advantage of diagnosing the state of a capacitor provided in the control unit 130 even if a special measuring device is not provided. In addition, the battery management apparatus 100 has an advantage of more effectively stabilizing the voltage applied to the control unit 130 by using a plurality of capacitors.

Figure 3:
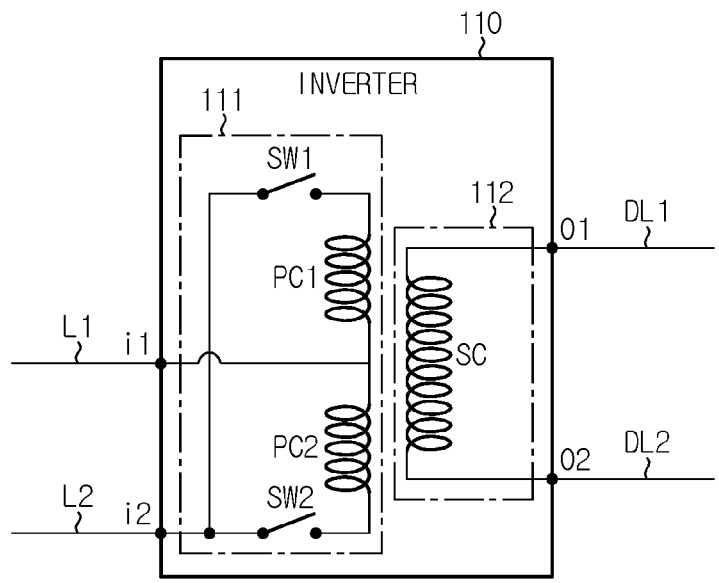
FIG. 3 is a diagram showing an exemplary configuration of an inverter according to an embodiment of the present disclosure.

FIG. 3 is a diagram showing an exemplary configuration of the inverter 110 according to an embodiment of the present disclosure.

Referring to FIG. 3, the inverter 110 may be configured to include a first unit circuit 111 and a second unit circuit 112. For example, as shown in FIG. 3, the first unit circuit 111 and the second unit circuit 112 may be formed to be physically separated.

The first unit circuit 111 may be formed so that the battery cell 10 is connected thereto.

Specifically, the first unit circuit 111 may be connected to the first input terminal it of the inverter 110, and the first line L1 connected to the positive electrode terminal of the battery cell 10 may be connected to the first input terminal it of the inverter 110. In addition, the first unit circuit 111 may be connected to the second input terminal i2 of the inverter 110, and the second line L2 connected to the negative electrode terminal of the battery cell 10 may be connected to the second input terminal i2 of the inverter 110. Therefore, the first unit circuit 111 may be connected to the first line L1 and the second line L2 through the first input terminal it and the second input terminal i2 of the inverter 110. As a result, the first unit circuit 111 may be connected to the battery cell 10.

The first unit circuit 111 may be configured such that the plurality of switches and a plurality of primary coils are arranged in series therein.

That is, the plurality of switches and the plurality of primary coils may form one closed circuit. In addition, the plurality of primary coils may be wound in the same direction.

Specifically, referring to FIG. 3, one end of the first switch SW1 may be connected to one end of the second switch SW2, and the other end may be connected to one end of the first primary coil PC1. In addition, the other end of the first primary coil PC1 may be connected to one end of the second primary coil PC2. The other end of the second primary coil PC2 may be connected to the other end of the second switch SW2.

In addition, a line connected between the other end of the first primary coil PC1 and one end of the second primary coil PC2 may be connected to the first input terminal it of the inverter 110, and thus connected to the first line L1. That is, the line connected between the other end of the first primary coil PC1 and one end of the second primary coil PC2 may be connected to the positive electrode terminal of the battery cell 10.

In addition, a line connected between one end of the second switch SW2 and one end of the first switch SW1 may be connected to the second input terminal i2 of the inverter 110, and thus connected to the second line L2. That is, the line connected between one end of the first switch SW1 and one end of the second switch SW2 may be connected to the negative electrode terminal of the battery cell 10.

Through such a circuit connection configuration, the first unit circuit 111 provided to the inverter 110 may be configured to be connected to the battery cell 10.

The second unit circuit 112 may be configured to be connected to the diagnosis line.

Specifically, the second unit circuit 112 may be connected to the first output terminal O1 of the inverter 110, and thus connected to the first diagnosis line DL1 connected to the first output terminal O1. In addition, the second unit circuit 112 may be connected to the second output terminal O2 of the inverter 110, and thus connected to the second diagnosis line DL2 connected to the second output terminal O2 of the inverter 110. Accordingly, the second unit circuit 112 may be connected to the first diagnosis line DL1 and the second diagnosis line DL2 through the first output terminal O1 and the second output terminal O2 of the inverter 110. As a result, the second unit circuit 112 may be connected to the plurality of capacitors provided in the control unit 130.

The second unit circuit 112 may include a secondary coil SC corresponding to the plurality of primary coils.

Referring to the embodiment of FIG. 3, the plurality of primary coils and the secondary coil SC may be disposed to face each other.

Specifically, the secondary coil SC may be disposed in the second unit circuit 112 to face the plurality of primary coils so that an electromotive force may be induced by the plurality of primary coils. That is, if a current flows through the plurality of primary coils, an electromotive force may be induced in the secondary coil SC by a magnetic field generated in the primary coils.

Preferably, the length of the secondary coil SC disposed in the second unit circuit 112 may be formed longer than the length of the primary coil disposed in the first unit circuit 111. For example, as shown in FIG. 3, the length of both ends of the secondary coil SC arranged in the second unit circuit 112 may be longer than the length from the center of the first primary coil PC1 arranged in the first unit circuit 111 to the center of the second primary coil PC2.

Alternatively, preferably, the length of the secondary coil SC disposed in the second unit circuit 112 may be formed to be longer than the sum of the lengths of the plurality of primary coils disposed in the first unit circuit 111. For example, the length of both ends of the secondary coil SC disposed in the second unit circuit 112 may be greater than or equal to the length from one end of the first primary coil PC1 disposed in the first unit circuit 111 to the other end of the second primary coil PC2.

Since the battery management apparatus 100 according to an embodiment of the present disclosure includes the inverter 110 having a simple circuit structure including a plurality of switches and a plurality of coils, the internal configuration of the battery pack 1 may be simplified, and there is an advantage that the DC current output from the battery cell 10 may be easily converted into an AC current.

Referring to the embodiment of FIG. 3, the plurality of switches provided in the inverter 110 may include a first switch SW1 and a second switch SW2.

In addition, the control unit 130 may be configured to alternately control the operation states of the first switch SW1 and the second switch SW2 according to a predetermined cycle.

For example, if the state of the first switch SW1 is controlled to a turn-on state by the control unit 130, the DC current output from the battery cell 10 may flow to the first primary coil PC1 and the first switch SW1. In this case, an induced electromotive force may be generated in the secondary coil SC by the magnetic field generated in the first primary coil PC1. In addition, the DC current may be output from the secondary coil SC toward the first diagnosis line DL1 by the generated induced electromotive force.

In addition, if the state of the first switch SW1 is controlled to a turn-off state by the control unit 130 and the state of the second switch SW2 is controlled to a turn-on state, the DC current output from the battery cell 10 may flow to the second primary coil PC2 and the second switch SW2. In this case, an induced electromotive force may be generated in the secondary coil SC by the magnetic field generated in the second primary coil PC2. In addition, the DC current may be output from the secondary coil SC toward the second diagnosis line DL2 by the generated induced electromotive force.

That is, since the first primary coil PC1 and the second primary coil PC2 are wound in the same direction, the current generated in the secondary coil SC may be output in different directions.

Accordingly, the control unit 130 may alternately control the operation states of the first switch SW1 and the second switch SW2 to a turn-on state and a turn-off state according to a predetermined cycle, so that the AC current is applied to the plurality of capacitors. Here, the predetermined cycle is a preset cycle, and may be a fixed value that is not changed according to the state of the battery pack 1 or the battery management apparatus 100 in order to accurately diagnose the state of the plurality of capacitors.

For example, one cycle may mean a time during which the operation state of the first switch SW1 is controlled from a turn-off state to a turn-on state and then comes to a turn-off state again and the operation state of the second switch SW2 is controlled from a turn-off state to a turn-on state from and then comes to a turn-off state again. That is, one cycle may mean a time when first switch SW1 is closed and opened once and then the second switch SW2 is closed and opened once. Accordingly, the control unit 130 may convert the DC current output from the battery cell 10 into an AC current by alternately controlling the states of the first switch SW1 and the second switch SW2 according to a predetermined cycle.

The battery management apparatus 100 according to an embodiment of the present disclosure has an advantage of converting a DC current to an AC current using an uncomplicated configuration by controlling the operation state of the plurality of switches, even if a separate AC power source is not provided.

If receiving a measurement command from the control unit 130, the measuring unit 120 may be configured to measure voltages at both ends of a shunt resistor provided on the diagnosis line and calculate a difference between the measured both-end voltages.

The shunt resistor SR may be disposed on at least one of the first diagnosis line DL1 and the second diagnosis line DL2. Hereinafter, for convenience of explanation, it will be described that the shunt resistor SR is disposed on the first diagnosis line DL1. In addition, the resistance of the shunt resistor SR is a predetermined value, and may be stored in advance in the control unit 130 or in a memory that the control unit 130 may refer to.

The measuring unit 120 may receive the measurement command through a line connected to the control unit 130. For example, the control unit 130 may send the measurement command to the measuring unit 120 while alternately controlling the operation states of the first switch SW1 and the second switch SW2. If receiving the measurement command from the control unit 130, the measuring unit 120 may measure the voltage at one end of the shunt resistor SR and the voltage at the other end thereof.

In addition, the measuring unit 120 may calculate a voltage drop by the shunt resistor SR by obtaining the difference between the measured voltage at one end of the shunt resistor SR and the measured voltage at the other end thereof.

The control unit 130 may include a third switch SW3 formed to select a capacitor to be connected to the diagnosis line among the plurality of capacitors according to an operation state.

For example, the control unit 130 may include the third switch SW3 capable of connecting each of the plurality of capacitors to the diagnosis line, and may be configured to diagnose the state of each of the plurality of capacitors or the plurality of capacitors by controlling an operation state of the third switch SW3.

As another example, the control unit 130 may include the third switch SW3 configured simpler, and may be configured to diagnose the state of some of the plurality of capacitors or the plurality of capacitors by controlling the operation state of the third switch SW3. In this case, the control unit 130 may be configured to diagnose a state of the capacitor that is not connected to the diagnosis line by comparing the diagnosis result obtained by diagnosing the state of the plurality of capacitors with the diagnosis result obtained by diagnosing the state of some of the capacitors.

The third switch SW3 will be described in detail with reference to FIGS. 4 to 6.

Figure 4:
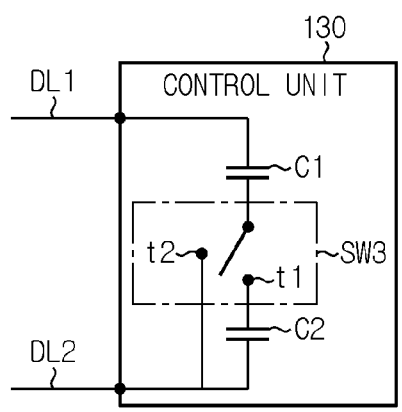
FIGS. 4 to 6 are diagrams showing an exemplary configuration of a control unit according to an embodiment of the present disclosure.
Figure 5:
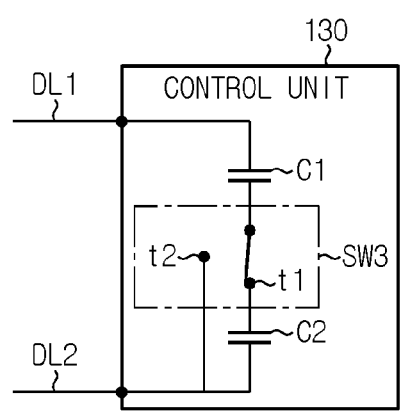
Figure 6:
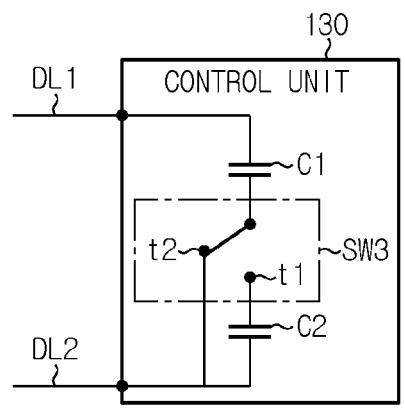

FIGS. 4 to 6 are diagrams showing an exemplary configuration of the control unit 130 according to an embodiment of the present disclosure.

Specifically, FIG. 4 is a diagram illustrating an example in which the conductor included in the third switch SW3 is not connected to both the first terminal t1 and the second terminal t2. FIG. 5 is a diagram illustrating an example in which the conductor included in the third switch SW3 is connected to the first terminal t1. FIG. 6 is a diagram illustrating an example in which the conductor included in the third switch SW3 is connected to the second terminal t2. Here, the conductor included in the third switch SW3 may be an object with conductivity, for example a steel plate formed in a flat shape.

Referring to FIG. 5, the control unit 130 may control the operation state of the third switch SW3 so that the conductor contacts the first terminal t1, thereby allowing both the first capacitor C1 and the second capacitor C2 to be connected to the diagnosis line.

Also, referring to FIG. 6, the control unit 130 may control the operation state of the third switch SW3 so that the conductor contacts the second terminal t2, thereby allowing the first capacitor C1 to be connected to the diagnosis line.

In addition, the control unit 130 may be configured to diagnose the state of each of the plurality of capacitors by controlling the operation state of the third switch SW3.

For example, referring to FIG. 5, the control unit 130 may control the conductor to come into contact with the first terminal t1, thereby diagnosing the states of the first capacitor C1 and the second capacitor C2 together.

As another example, referring to FIG. 6, by controlling the conductor to contact the second terminal t2, the control unit 130 may diagnose the state of the first capacitor C1. In this case, the control unit 130 may determine the state of the second capacitor C2 by comparing the diagnosis result of the first capacitor C1 and the second capacitor C2 diagnosed in the embodiment of FIG. 5 with the diagnosis result of the first capacitor C1 diagnosed in the embodiment of FIG. 6.

That is, as described above, the control unit 130 may connect some or all of the plurality of capacitors to the diagnosis line by controlling the operation state of the third switch SW3, in particular the conductor provided in the third switch SW3. In addition, the control unit 130 may diagnose the state of the capacitor connected to the diagnosis line by controlling the operation state of the plurality of switches provided in the inverter 110.

Therefore, even if a diagnosis line is not provided to each of the plurality of capacitors, the battery management apparatus 100 according to an embodiment of the present disclosure has an advantage of conveniently diagnosing the state of each of the plurality of capacitors through a relatively simple configuration such as the third switch SW3.

The control unit 130 may be configured to control the operation state of the third switch SW3 when the received measurement result is different from a reference value over a predetermined level.

Here, the reference value may be set according to the number of capacitors connected to the diagnosis line. That is, the reference value may be a voltage drop by the shunt resistor SR, which is measured by the measuring unit 120 when one or more capacitors in a normal state are connected to the diagnosis line. Accordingly, the control unit 130 may diagnose the state of the capacitor provided therein when the reference value is different from the received measurement result over a predetermined level.

In addition, here, the predetermined level may be a predetermined margin section prepared for the case where a value measured by the measuring unit 120 is not accurate due to internal or external factors of the battery pack 1.

For example, the predetermined level may be set to 5% of the reference value. It is assumed that the reference value is 3 [uV]. If the plurality of capacitors are connected to the diagnosis line and the measurement result differs from the reference value by 0.15 [uV] or more, the control unit 130 may determine that the state of the plurality of capacitors connected to the diagnosis line is not a normal state.

Meanwhile, the voltage drop by the shunt resistor SR may be explained using Equation 1 below.

$$Vd = I \times Rsr \quad \text{[Equation 1]}$$

Here, Vd is the voltage drop by the shunt resistor SR, I is the current flowing through the shunt resistor SR, and Rsr is the resistance of the shunt resistor SR.

That is, the measuring unit 120 may measure the voltage drop (Vd) by the shunt resistor SR by measuring the both-end voltages of the shunt resistor SR and calculating the difference between the measured both-end voltages. In addition, the control unit 130 may receive the voltage drop (Vd) by the shunt resistor SR from the measuring unit 120.

Here, the current (I) flowing through the shunt resistor SR may be explained using Equation 2 below.

$$I = Vb \div Xc \quad \text{[Equation 2]}$$

Here, I is the current flowing through the shunt resistor SR, Vb is the voltage value of the battery cell 10, and Xc is the reactance of the capacitor connected to the diagnosis line. Since the resistance of the shunt resistor SR is much smaller than the reactance of the capacitor, it does not affect the calculation of the current (I) flowing through the shunt resistor SR.

In other words, since the current (I) flowing through the shunt resistor SR is affected by the reactance (Xc) of the capacitor connected to the diagnosis line, the control unit 130 may diagnose the state of the capacitor provided inside based on the voltage drop by the shunt resistor SR measured by the measuring unit 120.

If the battery management apparatus 100 according to an embodiment of the present disclosure is used, the states of the plurality of capacitors may be quickly and conveniently measured based on the voltage drop by the shunt resistor SR.

The control unit 130 may be configured to control the operation state of the third switch SW3 such that a predetermined capacitor among the plurality of capacitors is connected to the diagnosis line.

For example, as in the embodiment of FIG. 6, the control unit 130 may control the operation state of the third switch SW3 so that the conductor contacts the second terminal t2, thereby allowing the first capacitor C1 to be connected to the diagnosis line.

Then, the control unit 130 may be configured to control the operation state of the plurality of switches so that the AC current is output. That is, the control unit 130 may control the operation state of the plurality of switches provided in the inverter 110 again in order to diagnose the state of the predetermined capacitor connected to the diagnosis line.

In addition, the control unit 130 may send a measurement command to the measuring unit 120. After that, the control unit 130 may be configured to diagnose the state of the predetermined capacitor based on the re-measurement result received from the measuring unit 120.

Figure 7:
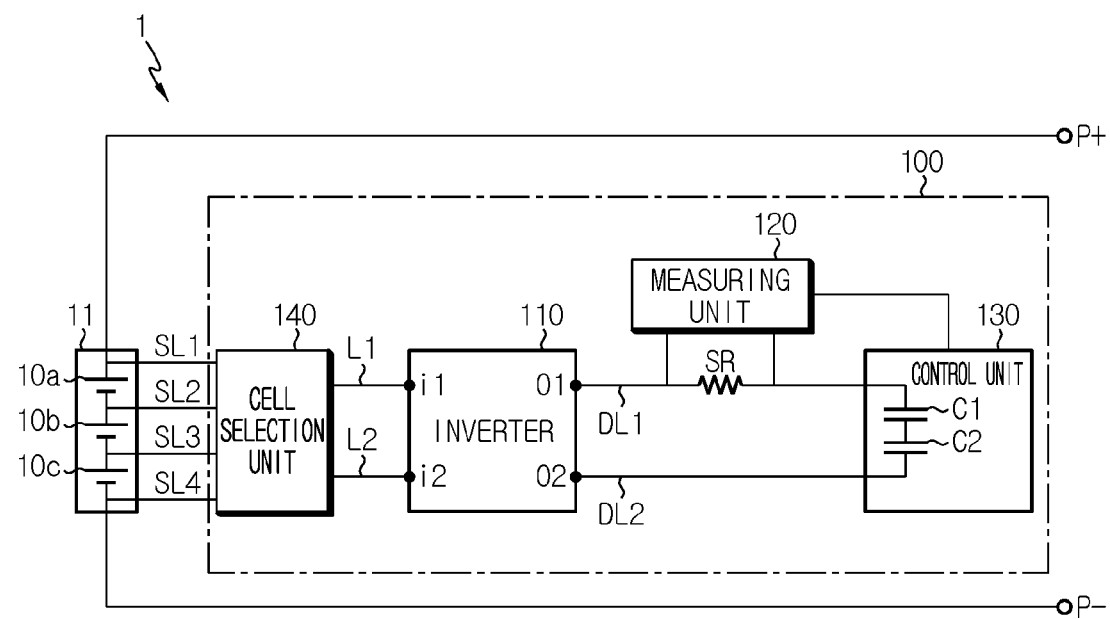
FIG. 7 is a diagram showing an exemplary configuration of a battery pack including a battery management apparatus according to another embodiment of the present disclosure.

FIG. 7 is a diagram showing an exemplary configuration of a battery pack 1 including a battery management apparatus 100 according to another embodiment of the present disclosure.

Referring to FIG. 7, a plurality of battery cells 10 may be provided in the battery pack 1. For example, the battery pack 1 may include a battery module in which one or more battery cells 10 are connected in series and/or in parallel.

In addition, the battery management apparatus 100 may further include a cell selection unit 140 connected between the plurality of battery cells 10a, 10b, 10c and the inverter 110. That is, the cell selection unit 140 may be connected between the battery module and the inverter 110.

For example, in the embodiment of FIG. 7, the cell selection unit 140 may be connected to the first battery cell 10a through a first sensing line SL1 and a second sensing line SL2, connected to the second battery cell 10b through the second sensing line SL2 and a third sensing line SL3, and connected to the third battery cell 10c through the third sensing line SL3 and a fourth sensing line SL4.

In addition, the cell selection unit 140 may be connected to the inverter 110 through the first line L1 and second line L2.

In addition, the cell selection unit 140 may be configured to select a battery cell 10 to be connected to the inverter 110 among the plurality of battery cells 10a, 10b, 10c according to a cell selection command received from the control unit 130.

Therefore, even if the plurality of battery cells 10a, 10b, 10c are provided inside the battery pack 1, the battery management apparatus 100 may further include the cell selection unit 140 capable of connecting each of the plurality of battery cells 10a, 10b, 10c to the inverter 110. Therefore, since the battery management apparatus 100 may receive the current required for diagnosing a state of the capacitor from the battery cell 10 selected from the plurality of battery cells 10a, 10b, 10c, the state of the capacitor may be diagnosed based on the capacity state of the battery cell 10.

Figure 8:
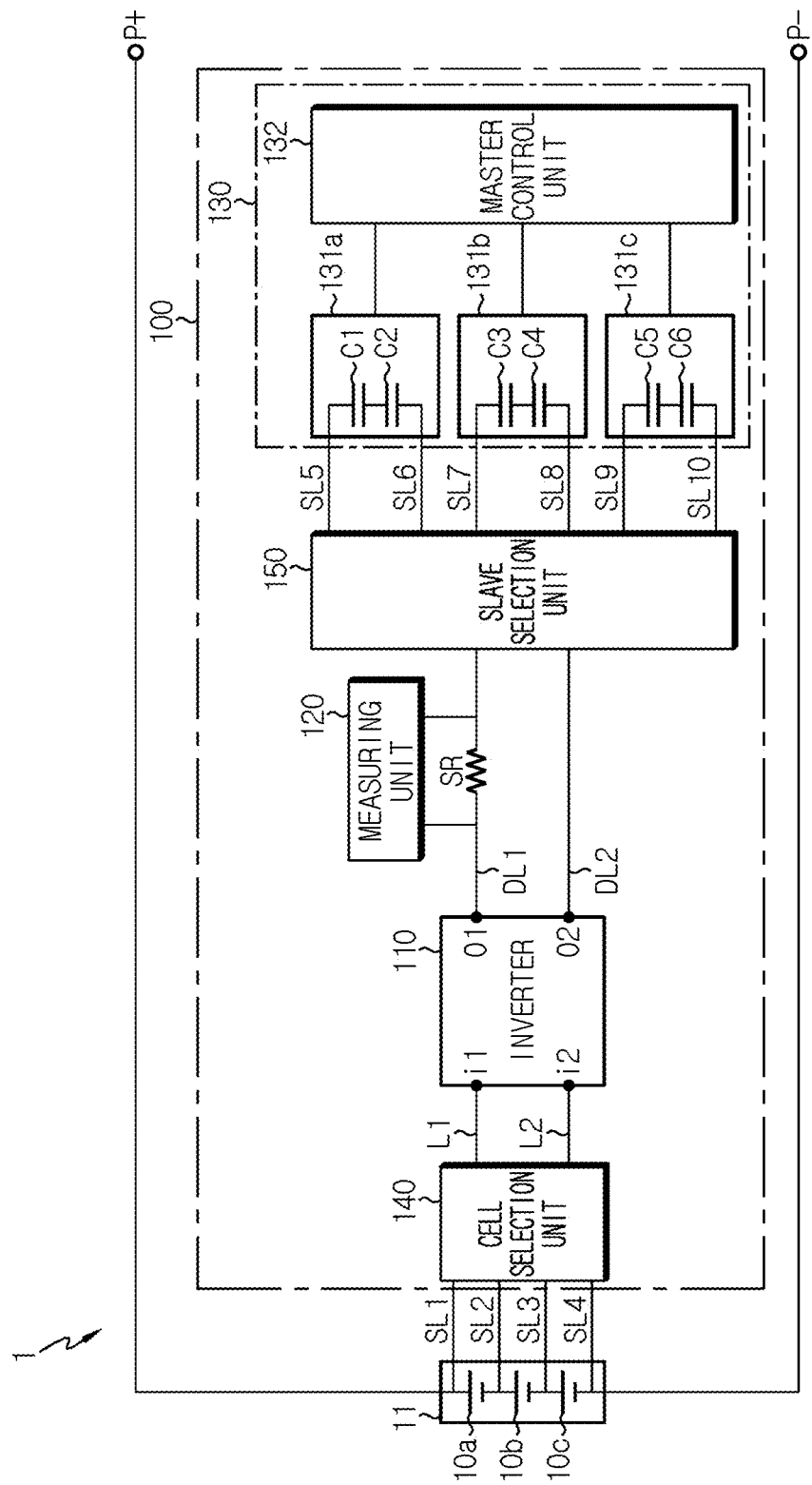
FIG. 8 is a diagram showing an exemplary configuration of the battery pack including the battery management apparatus according to another embodiment of the present disclosure.

FIG. 8 is a diagram showing an exemplary configuration of the battery pack 1 including the battery management 100 apparatus according to another embodiment of the present disclosure.

Referring to FIG. 8, the control unit 130 may be configured to include a plurality of slave control units 131a, 131b, 131c, each including the plurality of capacitors; and a master control unit 132 connected to the plurality of slave control units 131a, 131b, 131c and sending the cell selection command to the cell selection unit 140. Here, the master control unit 132 may be configured to control the plurality of slave control units 131a, 131b, 131c, respectively.

In addition, the battery management apparatus 100 may further include a slave selection unit 150 connected between the inverter 110 and the plurality of slave control units 131a, 131b, 131c.

For example, in the embodiment of FIG. 8, the slave selection unit 150 may be connected to the first slave control unit 131a through a fifth sensing line SL5 and a sixth sensing line SL6, connected to the second slave control unit 131b through a seventh sensing line SL7 and an eighth sensing line SL8, and connected to the third slave control unit 131c through a ninth sensing line SL9 and a tenth sensing line SL10.

The slave selection unit 150 may be configured to select a slave control unit to be connected to the inverter 110 through the diagnosis line among the plurality of slave control units 131a, 131b, 131c according to the slave selection command received from the master control unit 132. In addition, in the embodiment of FIG. 8, the cell selection unit 140 may be configured to select a battery cell 10 to be connected to the inverter 110 among the plurality of battery cells 10a, 10b, 10c according to the cell selection command received from the master control unit 132.

That is, the master control unit 132 may select a slave control unit capable of diagnosing the capacitor provided therein through the slave selection unit 150, and select a battery cell 10 for supplying the DC current required for diagnosing the capacitor through the cell selection unit 140.

Therefore, even if the plurality of battery cells 10a, 10b, 10c and the plurality of slave control units 131a, 131b, 131c are included in the battery pack 1, the battery management apparatus 100 according to an embodiment of the present disclosure has an advantage of efficiently diagnosing the state of the plurality of capacitors C1, C2, C3, C4, C5, C6 provided in the plurality of slave control units 131a, 131b, 131c by using one inverter 110.

Figure 9:
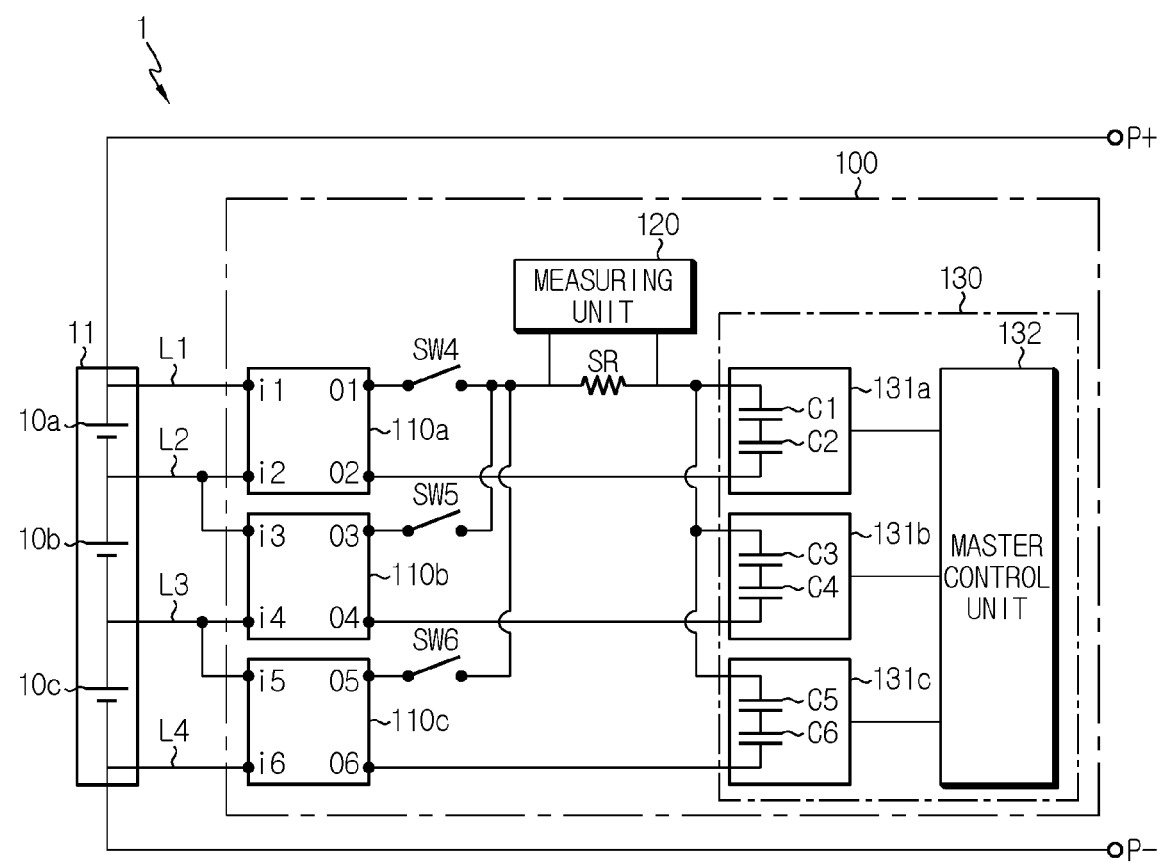
FIG. 9 is a diagram showing an exemplary configuration of a battery pack including a battery management apparatus according to another embodiment of the present disclosure.

FIG. 9 is a diagram showing an exemplary configuration of a battery pack 1 including a battery management apparatus 100 according to another embodiment of the present disclosure.

Referring to FIG. 9, a plurality of the battery cell 10 may be provided, and a plurality of the inverter 110 may be provided to correspond to the plurality of battery cells 10a, 10b, 10c, respectively.

That is, in the battery pack 1, the same number of battery cells 10 and inverters 110 may be provided to correspond to each other one by one.

The control unit 130 may include a plurality of slave control units 131a, 131b, 131c configured to respectively correspond to the plurality of inverters 110a, 110b, 110c and respectively have the plurality of capacitors. That is, the battery cells 10, the inverters 110 and the slave control units may be provided in the same number inside the battery pack 1.

For example, in the embodiment of FIG. 9, the first inverter 110a may include a first input terminal i1, a second input terminal i2, a first output terminal O1, and a second output terminal O2. In addition, the second inverter 110b may include a third input terminal i3, a fourth input terminal i4, a third output terminal O3, and a fourth output terminal O4. Also, the third inverter 110c may include a fifth input terminal i5, a sixth input terminal i6, a fifth output terminal O5, and a sixth output terminal O6.

In addition, the first line L1 may be connected to the first input terminal i1, and the second line L2 may be connected to the second input terminal i2 and the third input terminal i3. The third line L3 may be connected to the fourth input terminal i4 and the fifth input terminal i5, and the fourth line L4 may be connected to the sixth input terminal i6.

In addition, the control unit 130 may be configured to include a master control unit 132 connected to the plurality of slave control units 131a, 131b, 131c and configured to designate a slave control unit that diagnoses the state of the plurality of capacitors provided therein, among the plurality of slave control units 131a, 131b, 131c.

In this case, the master control unit 132 may be configured to control the operation state of the switch provided on the diagnosis line connected to the designated slave control unit to diagnose the state of the plurality of capacitors provided inside the designated slave control unit.

For example, in the embodiment of FIG. 9, if the master control unit 132 designates the first slave control unit 131a, the master control unit 132 may control the operation state of the fourth switch SW4 provided on the diagnosis line connected to the first slave control unit 131a to a turn-on state. At this time, the operation state of a fifth switch SW5 and a sixth switch SW6 may be controlled to a turn-off state by the master control unit 132.

The battery management apparatus 100 according to the present disclosure may be applied to a battery management system (BMS). That is, the BMS according to the present disclosure may include the battery management apparatus 100 described above. In this configuration, at least some components of the battery management apparatus 100 may be implemented by supplementing or adding functions of components included in the conventional BMS. For example, the inverter 110, the measuring unit 120 and the control unit 130 may be implemented as components of the BMS.

In addition, the battery management apparatus 100 according to the present disclosure may be provided to a battery pack 1. That is, the battery pack 1 according to the present disclosure may include the battery management apparatus 100 described above and one or more battery cells. In addition, the battery pack 1 may further include electrical equipment (a relay, a fuse, etc.) and a case.

The embodiments of the present disclosure described above may not be implemented only through an apparatus and method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

In addition, since the present disclosure described above can be substituted, modified and changed in various ways by those skilled in the art without departing from the technical idea of the present disclosure, the present disclosure is not limited by the embodiments described above and the accompanying drawings, and all or some of the embodiments may be selectively combined to enable various modifications.

EXPLANATION OF REFERENCE SIGNS

1: battery pack
10: battery cell
100: battery management apparatus
110: inverter
111: first unit circuit
112: second unit circuit
120: measuring unit
130: control unit
140: cell selection unit
150: slave selection unit

What is claimed is:

1. A battery management apparatus, comprising:
   an inverter connected to a battery cell and including a plurality of switches, the inverter configured to convert a DC current output from the battery cell into an AC current according to respective operation states of the plurality of switches;
   a sensor connected to a diagnosis line at which the AC current is output, the sensor configured to measure a voltage of the diagnosis line and output the measured voltage; and
   a controller including a plurality of capacitors connected to the diagnosis line, wherein the controller is configured to:
     control the respective operation states of the plurality of switches;
     receive the measured voltage from the sensor; and
     diagnose a state of the plurality of capacitors based on the received measured voltage.

2. The battery management apparatus according to claim 1, wherein the inverter includes:
a first unit circuit connected to the battery cell and including the plurality of switches and a plurality of primary coils arranged in series; and
a second unit circuit connected to the diagnosis line and including a secondary coil inductively coupled to the plurality of primary coils.

3. The battery management apparatus according to claim 1,
wherein the controller is configured to alternately control the respective operation states of a first switch and a second switch of the plurality of switches according to a predetermined cycle.

4. The battery management apparatus according to claim 1,
wherein the sensor is configured to:
measure voltages at both ends of a shunt resistor provided on the diagnosis line in response to a measurement command received from the controller; and
calculate a difference between the measured voltages at both ends of the shunt resistor.

5. The battery management apparatus according to claim 1,
wherein the controller includes a third switch configured to switchably control selection from among the plurality of capacitors to be connected to the diagnosis line, and wherein the controller is configured to diagnose a state of each of the plurality of capacitors by controlling the third switch.

6. The battery management apparatus according to claim 5,
wherein the controller is configured to control the third switch in response to the received measured voltage being different from a reference value by a predetermined amount or more.

7. The battery management apparatus according to claim 6,
wherein the controller is configured to:
control connection of a predetermined capacitor of the plurality of capacitors to the diagnosis line by the third switch;
control the respective operation states of the plurality of switches to output the AC current; and
diagnose a state of the predetermined capacitor based on a re-measurement of the measured voltage received from the sensor.

8. The battery management apparatus according to claim 1,
wherein the inverter is connected to a plurality of battery cells including the battery cell, and wherein the battery management apparatus is configured to select one of the plurality of battery cells to be connected to the inverter according to a cell selection command of the controller.

9. The battery management apparatus according to claim 8,
wherein the controller includes:
a plurality of slave controllers, each slave controller including a respective plurality of capacitors; and
a master controller connected to the plurality of slave controllers and configured to generate the cell selection command,
wherein the battery management apparatus is configured to connect one of the plurality of slave controllers to the inverter through the diagnosis line in response to a slave selection command generated by the master controller.

10. The battery management apparatus according to claim 1,
comprising a plurality of inverters including the inverter connected to a plurality of battery cells including the battery cell in a one-to-one correspondence,
wherein the controller includes:
a plurality of slave controllers, wherein each respective slave controller corresponds to a respective one of the plurality of inverters and includes a respective plurality of capacitors; and
a master controller connected to the plurality of slave controllers and configured to designate one of the slave controllers to diagnose the state of the plurality of capacitors included in the designated slave.

11. A battery pack, comprising the battery management apparatus according to claim 1.

* * * * *